(12) United States Patent
Yun et al.

(10) Patent No.: US 11,812,613 B2
(45) Date of Patent: Nov. 7, 2023

(54) SEMICONDUCTOR MEMORY DEVICE INCLUDING SELECT TRANSISTOR WITH LOW DIELECTRIC CORE INSULATING LAYER AND METHOD OF MANUFACTURING THE SAME

(71) Applicant: SK hynix Inc., Icheon-si (KR)

(72) Inventors: Dae Hwan Yun, Icheon-si (KR); Gil Bok Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 162 days.

(21) Appl. No.: 17/211,460

(22) Filed: Mar. 24, 2021

(65) Prior Publication Data

US 2022/0102371 A1 Mar. 31, 2022

(30) Foreign Application Priority Data

Sep. 25, 2020 (KR) .................. 10-2020-0125019

(51) Int. Cl.
  *H10B 43/35* (2023.01)
  *H10B 43/27* (2023.01)
  *H10B 43/10* (2023.01)

(52) U.S. Cl.
  CPC .............. *H10B 43/27* (2023.02); *H10B 43/10* (2023.02); *H10B 43/35* (2023.02)

(58) Field of Classification Search
  CPC ......... H01L 27/11582; H01L 27/11565; H01L 27/1157; H01L 27/11568; H01L 27/11521; H01L 27/11524; H01L 27/11556; H01L 29/40117; H01L 29/7926; H01L 29/66833; H01L 29/792
  See application file for complete search history.

(56) References Cited

U.S. PATENT DOCUMENTS

| | | | |
|---|---|---|---|
| 2019/0312050 A1* | 10/2019 | Lai | H10B 43/27 |
| 2020/0058670 A1* | 2/2020 | Oh | H10B 43/35 |
| 2021/0249420 A1* | 8/2021 | Seki | H10B 43/10 |
| 2021/0265380 A1* | 8/2021 | Obu | H01L 29/1037 |

FOREIGN PATENT DOCUMENTS

| | | |
|---|---|---|
| KR | 1020100107661 A | 10/2010 |
| KR | 1020170006978 A | 1/2017 |

* cited by examiner

*Primary Examiner* — Eric K Ashbahian
*Assistant Examiner* — Halee Cramer
(74) *Attorney, Agent, or Firm* — WILLIAM PARK & ASSOCIATES LTD.

(57) ABSTRACT

The present technology relates to a semiconductor memory device and a method of manufacturing the same. The semiconductor memory device includes a stack with a plurality of interlayer insulating layers and a plurality of gate electrodes alternately stacked on a substrate, and a plurality of channel structures passing through the stack in a vertical direction. Each of the plurality of channel structures includes a core insulating layer, a channel layer, a tunnel insulating layer, and a charge storage layer that vertically extend in the same direction as the plurality of channel structures, and a dielectric constant of a partial region of the core insulating layer is lower than a dielectric constant of another region of the core insulating layer.

9 Claims, 17 Drawing Sheets

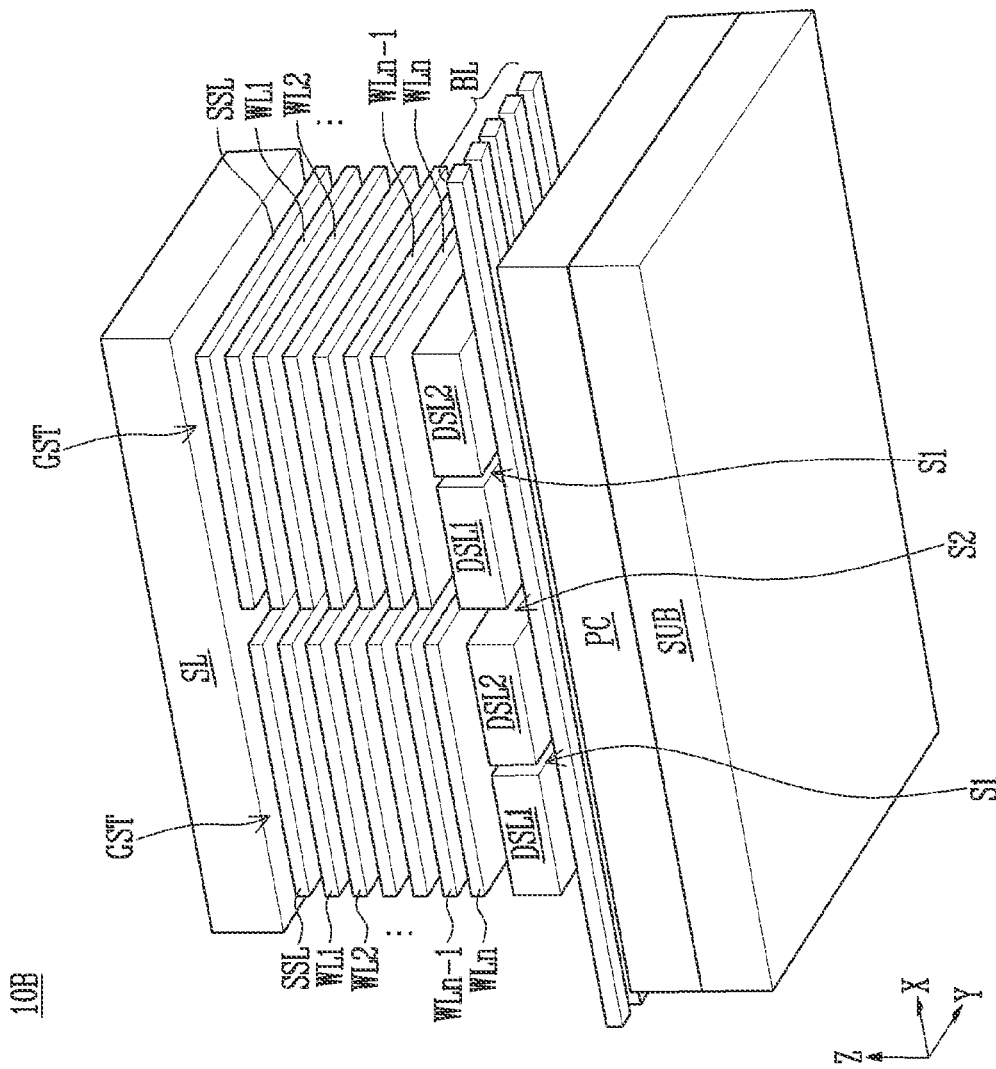

SEMICONDUCTOR MEMORY DEVICE INCLUDING SELECT TRANSISTOR WITH LOW DIELECTRIC CORE INSULATING LAYER AND METHOD OF MANUFACTURING THE SAME

CROSS-REFERENCE TO RELATED APPLICATION

The present application claims priority under 35 U.S.C. § 119(a) to Korean patent application number 10-2020-0125019 filed on Sep. 25, 2020, in the Korean Intellectual Property Office, the entire disclosure of which is incorporated by reference herein.

BACKGROUND

1. Technical Field

The present disclosure relates to an electronic device, and more particularly, to a semiconductor memory device of a vertical channel structure and a method of manufacturing the same.

2. Related Art

Recently, a paradigm for a computer environment has been transformed into ubiquitous computing, which enables a computer system to be used whenever and wherever. Therefore, a use of a portable electronic device, such as a mobile phone, a digital camera, and a notebook computer is rapidly increasing. Such a portable electronic device generally uses a memory system that uses a semiconductor memory device, that is, a data storage device. The data storage device is used as a main storage device or an auxiliary storage device of the portable electronic device.

The semiconductor data storage device by using the memory device has advantages that stability and durability are excellent because there is no mechanical driver, an access speed of information is very fast, and power consumption is low. As an example of the memory system with such advantages, a data storage device includes a universal serial bus (USB) memory device, a memory card with various interfaces, a solid state drive (SSD), and the like.

A memory device is largely divided into a volatile memory device and a nonvolatile memory device.

A write speed and a read speed of the nonvolatile memory device are relatively slow, however, the nonvolatile memory device maintains storage data even though power supply is shut off. Therefore, a nonvolatile memory device is used to store data to be maintained regardless of power supply. A nonvolatile memory device includes a read only memory (ROM), a mask ROM (MROM), a programmable ROM (PROM), an erasable programmable ROM (EPROM), an electrically erasable programmable ROM (EEPROM), a flash memory, a phase change random access memory (PRAM), a magnetic RAM (MRAM), a resistive RAM (RRAM), a ferroelectric RAM (FRAM), and the like. The flash memory is divided into a NOR type and a NAND type.

SUMMARY

A semiconductor memory device according to an embodiment of the present disclosure includes a stack with a plurality of interlayer insulating layers and a plurality of gate electrodes that are alternately stacked on a substrate, and a plurality of channel structures passing through the stack in a vertical direction. Each of the plurality of channel structures includes a core insulating layer, a channel layer, a tunnel insulating layer, and a charge storage layer that vertically extend in the same direction as the plurality of channel structures, and a dielectric constant of a partial region of the core insulating layer is lower than a dielectric constant of another region of the core insulating layer.

A semiconductor memory device according to an embodiment of the present disclosure includes a stack with a plurality of interlayer insulating layers and gate electrodes alternately stacked on a substrate, and a plurality of channel structures passing through the stack in a vertical direction. Each of the plurality of channel structures includes a core insulating layer, a channel layer, a tunnel insulating layer, and a charge storage layer that vertically extend in the same direction as the plurality of channel structures, at least one first gate electrode that is disposed at an uppermost portion of the gate electrodes corresponds to a drain select transistor, at least one second gate electrode that is disposed at a lowermost portion of the gate electrodes corresponds to a source select transistor, and remaining gate electrodes among the electrodes correspond to the memory cells, and a partial region of the core insulating layer that is adjacent to the first gate electrode or the second gate electrode has a dielectric constant that is lower than a dielectric constant of another region that is adjacent to the remaining gate electrodes.

A method of manufacturing a semiconductor memory device according to an embodiment of the present disclosure includes forming a stack by alternately stacking a plurality of interlayer insulating layers and a plurality of sacrificial layers on a substrate, forming a plurality of holes that pass through the stack in a vertical direction, sequentially forming a charge storage layer, a tunnel insulating layer, and a channel layer on sidewalls of each of the plurality of holes, forming a core insulating layer on a sidewall of the channel layer to fill center regions of the plurality of holes, and injecting a dopant into a partial region so that a dielectric constant of the partial region of the core insulating layer is lower than a dielectric constant of another region of the core insulating layer.

A method of manufacturing a semiconductor memory device according to an embodiment of the present disclosure includes forming a stack by alternately stacking a plurality of interlayer insulating layers and a plurality of sacrificial layers on a substrate, forming a plurality of holes that pass through the stack in a vertical direction, sequentially forming a charge storage layer, a tunnel insulating layer, and a channel layer on sidewalk of each of the plurality of holes, and forming a core insulating layer on a sidewall of the channel layer to fill a center region of the plurality of holes, and forming the core insulating layer includes forming a gap in a partial region of the core insulating layer.

A semiconductor memory device according to an embodiment of the present disclosure includes a stack with a plurality of interlayer insulating layers and a plurality of gate electrodes that are alternately stacked on a substrate, and a plurality of channel structures passing through the stack in a vertical direction. Each of the plurality of channel structures includes a core insulating layer, a channel layer, a tunnel insulating layer, and a charge storage layer that vertically extend in the same direction as the plurality of channel structures, and a dielectric constant of one portion of the core insulating layer is different from a dielectric constant of another portion of the core insulating layer.

A semiconductor memory device according to an embodiment of the present disclosure includes a stack with a plurality of interlayer insulating layers and a plurality of gate electrodes that are alternately stacked on a substrate, and a plurality of channel structures passing through the stack in a vertical direction. Each of the plurality of channel structures includes a core insulating layer, a channel layer, a tunnel insulating layer, and a charge storage layer that vertically extend in the same direction as the plurality of channel structures, and a gap is formed in a portion of the core insulating layer that is adjacent to a gate electrode.

BRIEF DESCRIPTION OF THE DRAWINGS

FIGS. 3A and 3B are perspective views schematically illustrating semiconductor memory devices according to embodiments of the present disclosure.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Hereinafter, embodiments of the present disclosure will be described in detail with reference to the accompanying drawings, so that those skilled in the art to which the present disclosure pertains may easily carry out the technical spirit of the present disclosure.

An embodiment of the present disclosure is to provide a semiconductor memory device capable of improving an erase characteristic by increasing a leakage current characteristics of select transistors included in cell strings and a gate induced drain leakage (GIDL) current, and a method of manufacturing the same.

According to the present technology, a leakage current characteristic of select transistors is improved by forming a core insulating layer of a low dielectric constant under a channel of the select transistors. In addition, a gate induced drain leakage (GIDL) current generated in the select transistors during an erase operation is increased, and thus an erase operation characteristic is improved.

Figure 1:
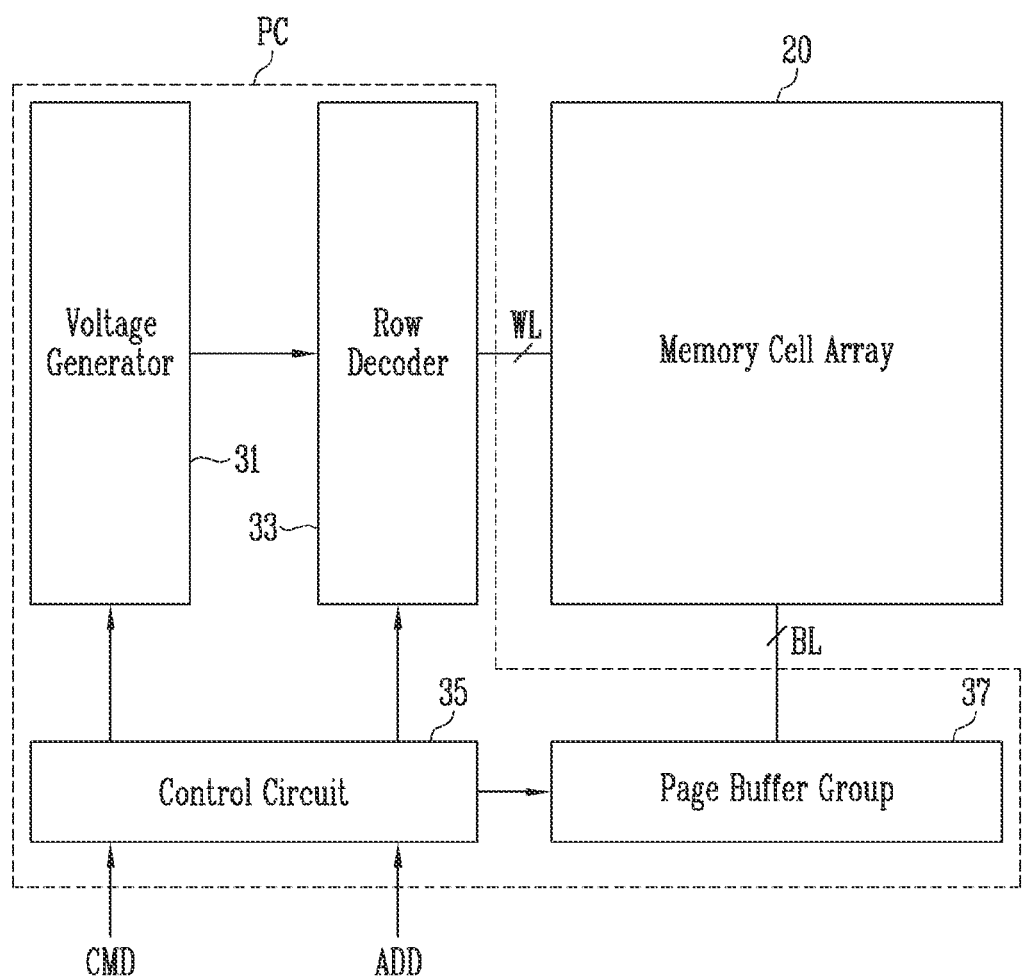
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, the semiconductor memory device 10 includes a peripheral circuit PC and a memory cell array 20.

The peripheral circuit PC may be configured to control a program operation for storing data in the memory cell array 20, a read operation for outputting data that is stored in the memory cell array 20, and an erase operation for erasing data that is stored in the memory cell array 20.

As an embodiment, the peripheral circuit PC may include a voltage generator 31, a row decoder 33, a control circuit 35, and a page buffer group 37.

The memory cell array 20 may include a plurality of memory blocks. The memory cell array 20 may be connected to the row decoder 33 through word lines WL and may be connected to the page buffer group 37 through bit lines BL.

The control circuit 35 may control the peripheral circuit PC based on a command CMD and an address ADD.

The voltage generator 31 may generate various operation voltages, such as a pre-erase voltage, an erase voltage, a ground voltage, a program voltage, a verify voltage, a pass voltage, and a read voltage used for the program operation, the read operation, and the erase operation based on the control circuit 35.

The row decoder 33 may select a memory block based on the control circuit 35. The row decoder 33 may be configured to apply the operation voltages to the word lines WL connected to the selected memory block.

The page buffer group 37 may be connected to the memory cell array 20 through the bit lines BL. The page buffer group 37 may temporarily store data received from an input/output circuit (not shown) during the program operation based on the control circuit 35. The page buffer group 37 may sense a voltage or a current of the bit lines BL during the read operation or the verify operation based on the control circuit 35. The page buffer group 37 may select the bit lines BL based on the control circuit 35.

Structurally, the memory cell array 20 may overlap a portion of the peripheral circuit PC.

Figure 2:
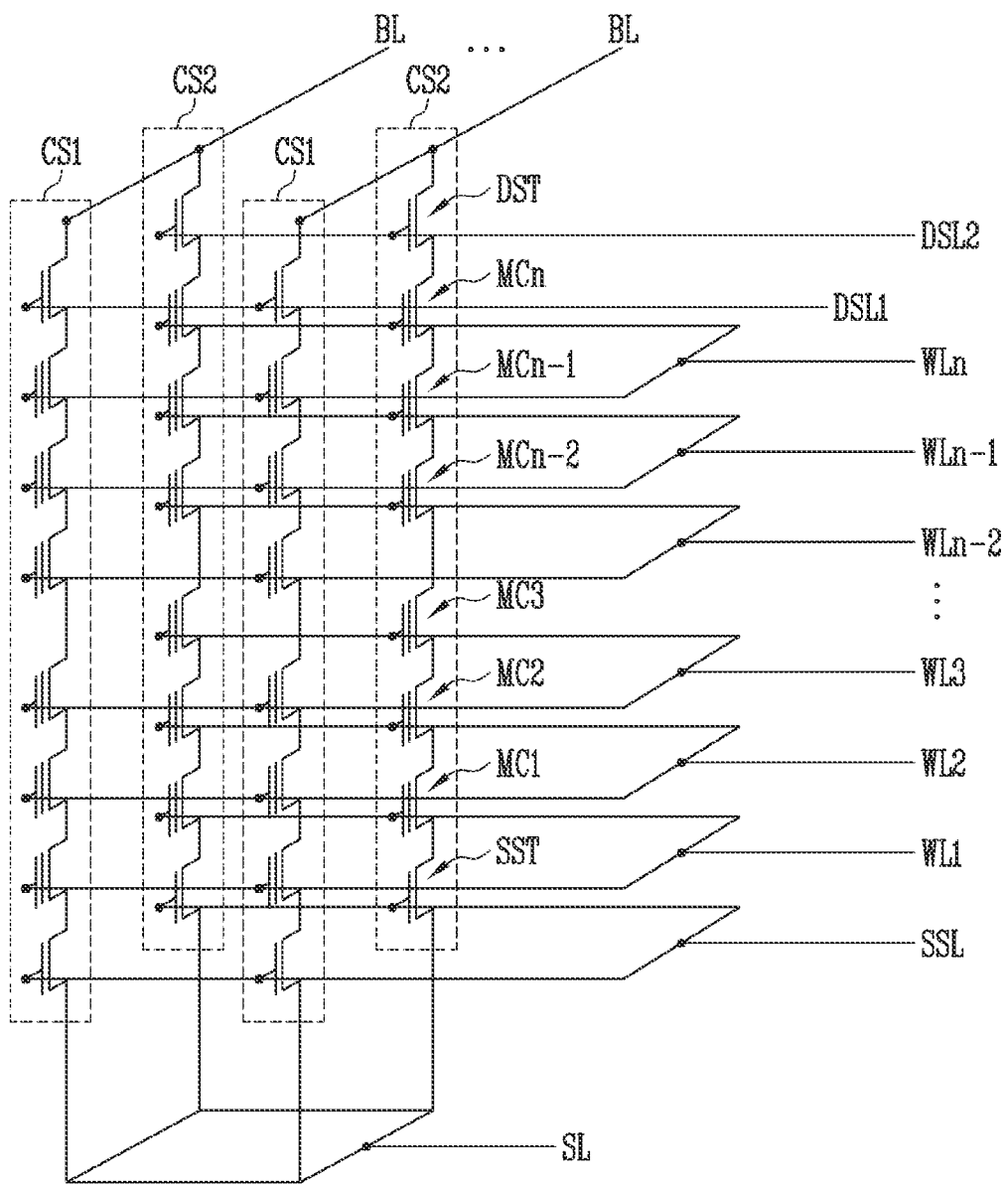
FIG. 2 is a circuit diagram illustrating a memory cell array of FIG. 1.

FIG. 2 is a circuit diagram illustrating the memory cell array of FIG. 1.

Referring to FIG. 2, the memory cell array 20 may include a plurality of cell strings CS1 and CS2 that are connected between a source line SL and a plurality of bit lines BL. The plurality of cell strings CS1 and CS2 may be commonly connected to a plurality of word lines WL1 to WLn.

Each of the plurality of cell strings CS1 and CS2 may include at least one source select transistor SST that is connected to the source line SL, at least one drain select transistor DST that is connected to the bit line BL, and a plurality of memory cells MC1 to MCn that is connected in series between the source select transistor SST and the drain select transistor DST.

The gates of the plurality of memory cells MC1 to MCn may be respectively connected to the plurality of word lines WL1 to WLn that are spaced apart from each other and stacked. The plurality of word lines WL1 to WLn may be disposed between a source select line SSL and two or more drain select lines DSL1 and DSL2. The two or more drain select lines DSL1 and DSL2 may be spaced apart from each other at the same level.

The gate of the source select transistor SST may be connected to the source select line SSL. The gate of the drain select transistor DST may be connected to a drain select line that corresponds to the gate of the drain select transistor DST.

The source line SL may be connected to a source of the source select transistor SST. A drain of the drain select transistor DST may be connected to a bit line that corresponds to the drain of the drain select transistor DST.

The plurality of cell strings CS1 and CS2 may be divided into string groups that are respectively connected to the two or more drain select lines DSL1 and DSL2. Cell strings that are connected to the same word line and the same bit line may be independently controlled by different drain select lines. In addition, cell strings that are connected to the same drain select line may be independently controlled by different bit lines.

As an embodiment, the two or more drain select lines DSL1 and DSL2 may include a first drain select line DSL1 and a second drain select line DSL2. The plurality of cell strings CS1 and CS2 may include a first cell string CS1 of a first string group that is connected to the first drain select line DSL1 and a second string CS2 of a second string group that is connected to the second drain select line DSL2.

Figure 3A:
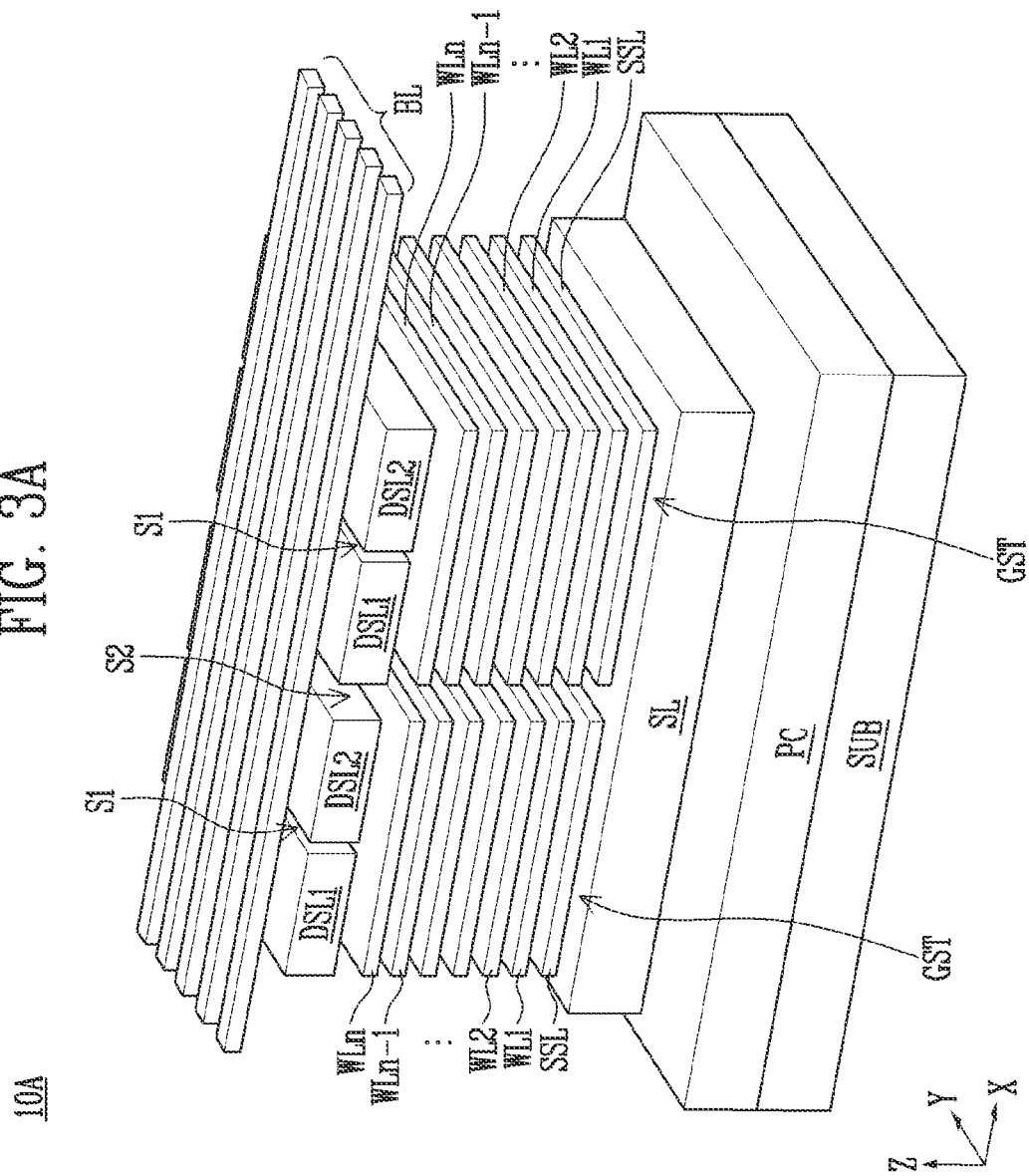

FIGS. 3A and 3B are perspective views schematically illustrating semiconductor memory devices according to embodiments of the present disclosure.

Referring to FIGS. 3A and 3B, each of the semiconductor memory devices 10A and 10B may include the peripheral circuit PC that is disposed on a substrate SUB and gate stacks GST overlapping the peripheral circuit PC.

Each of the gate stacks GST may include the source select line SSL, the plurality of word lines WL1 to WLn, and the two or more drain select lines DSL1 and DSL2 that are separated from each other at the same level by a first slit S1.

The source select line SSL and the plurality of word lines WL1 to WLn may extend in a first direction X and a second direction Y, and may be formed in a flat plate shape parallel to an upper surface of the substrate SUB. The first direction X may be a direction in which an X-axis of an XYZ coordinate system is directed, and the second direction Y may be a direction in which a Y-axis of the XYZ coordinate system is directed.

The plurality of word lines WL1 to WLn may be spaced apart from each other and stacked in a third direction Z. The third direction Z may be a direction in which a Z axis of the XYZ coordinate system is directed. The plurality of word lines WL1 to WLn may be disposed between the two or more drain select lines DSL1 and DSL2 and the source select line SSL.

The gate stacks GST may be separated from each other by a second slit S2. The first slit S1 may be formed shorter in the third direction Z than the second slit S2 and may overlap the plurality of word lines WL1 to WLn.

Each of the first slit S1 and the second slit S2 may extend in a straight line, a zigzag shape, or a wave shape. Widths of each of the first slit S1 and the second slit S2 may be variously changed according to a design rule.

Referring to FIG. 3A, the source select line SSL according to an embodiment may be disposed closer to the peripheral circuit PC than the two or more drain select lines DSL1 and DSL2.

The semiconductor memory device 10A may include the source line SL that is disposed between the gate stacks GST and the peripheral circuit PC, and the plurality of bit lines BL spaced farther from the peripheral circuit PC than the source line SL. The gate stacks GST may be disposed between the plurality of bit lines BL and the source line SL.

Referring to FIG. 3B, the two or more drain select lines DSL1 and DSL2, according to an embodiment, may be disposed closer to the peripheral circuit PC than the source select line SSL.

The semiconductor memory device 10B may include the plurality of bit lines BL that are disposed between the gate stacks GST and the peripheral circuit PC, and the source line SL may be farther from the peripheral circuit PC than the plurality of bit lines BL. The gate stacks GST may be disposed between the plurality of bit lines BL and the source line SL.

Again, referring to FIGS. 3A and 3B, the plurality of bit lines BL may be formed of various conductive materials. The source line SL may include a doped semiconductor layer. As an embodiment, the source line SL may include an n-type doped silicon layer.

Although not shown in the drawing, the peripheral circuit PC may be electrically connected to the plurality of bit lines BL, the source line SL, and the plurality of word lines WL1 to WLn through interconnections of various structures.

Figure 4:
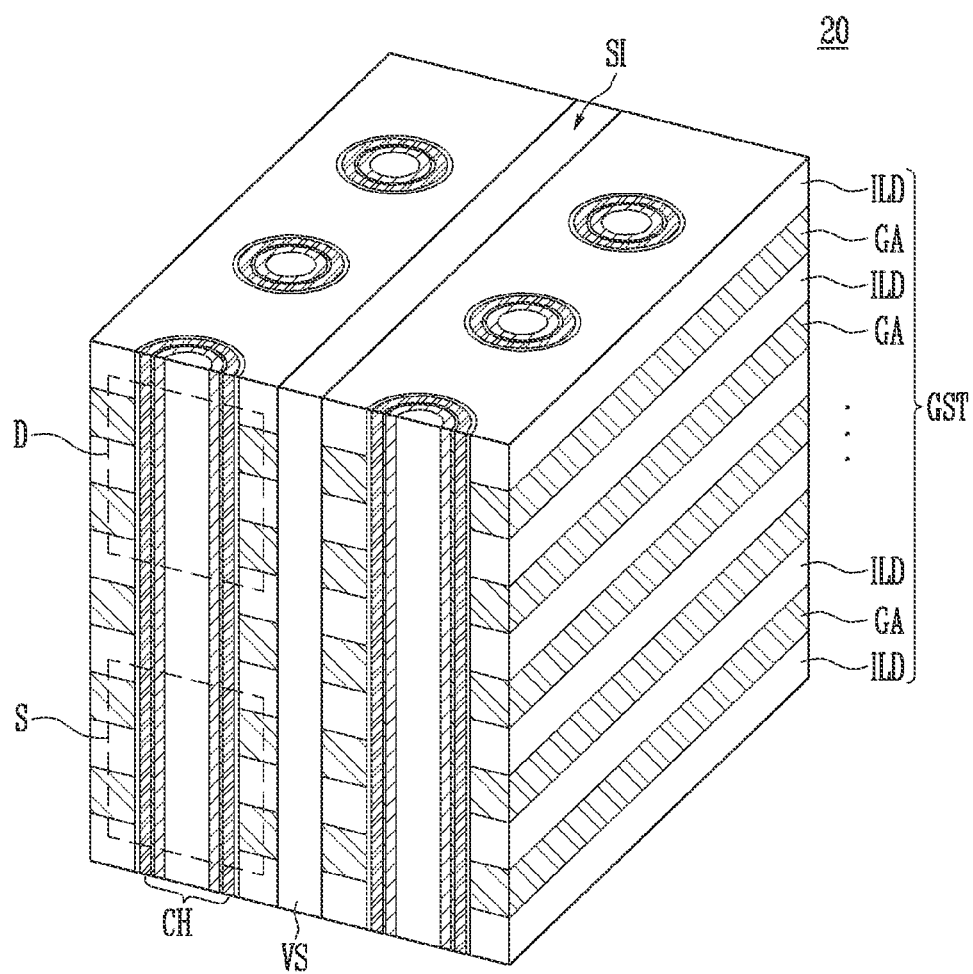
FIG. 4 is a perspective view illustrating a portion of a memory cell array of a semiconductor memory device according to an embodiment of the present disclosure.

FIG. 4 is a perspective view illustrating a portion of a memory cell array of a semiconductor memory device according to an embodiment of the present disclosure.

Referring to FIG. 4, the memory cell array 20 may include gate stacks GST that are separated from each other by a slit SI and channel structures CH that pass through each of the gate stacks GST.

The slit SI may be filled with a vertical structure VS. As an embodiment, the vertical structure VS may include an insulating material.

Each of the gate stacks GST may include interlayer insulating layers ILD and gate electrodes GA that are alternately stacked in one direction. Hereinafter, the direction in which the interlayer insulating layers ILD and the gate electrodes GA are alternately stacked is referred to as a stack direction.

At least one gate electrode that is disposed at a lowermost layer of the gate electrodes GA may be used as the source select line, and at least one gate electrode that is disposed at an upper most layer may be used as the drain select line.

The gate electrodes GA lay include at least one of a doped semiconductor, a metal, a metal silicide, or a metal nitride layer. The gate electrodes GA may be used as a gate electrode of a memory cell or a gate electrode of a select transistor.

The channel structure CH may extend in the stack direction and may be surrounded by the gate electrodes GA.

The channel structure CH is formed so that a dielectric constant of a core insulating layer that is adjacent to the drain select transistor or the source select transistor is lower than that of the core insulating layer that is adjacent to the memory cells. For example, the channel structure CH may be formed by injecting an impurity into the core insulating layer that is adjacent to the drain select transistor or the source select transistor.

In an embodiment of the present disclosure, as shown in FIG. 3A described above, an embodiment in which one or more gate stacks that are disposed at a lowermost portion of the gate stacks GST may be used as the source select line and one or more gate stacks that are disposed at an uppermost portion may be used as the drain select line is described as an example. However, the present disclosure is not limited thereto, and as shown in FIG. 3B described above, one or more gate stacks that are disposed at the lowermost portion may be used as the drain select line and one or more gate stacks that are disposed at the uppermost portion of the gate stacks GST may be used as the source select line.

Figure 5A:
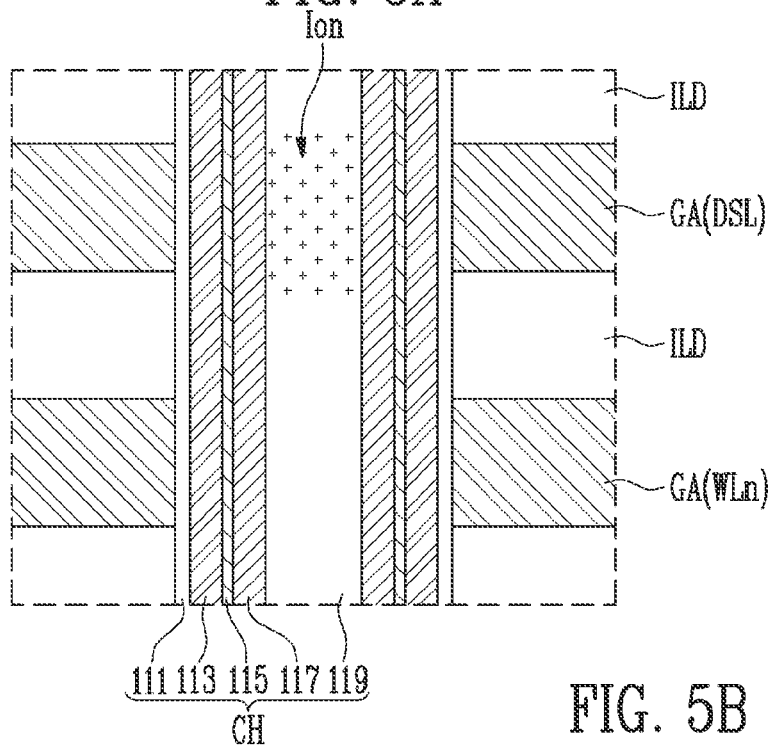
FIG. 5A is an enlarged view of a region D of FIG. 4.

FIG. 5A is an enlarged view of a region D of FIG. 4.

Referring to 5A, the channel structure CH may include a blocking insulating layer 111, a charge storage layer 113, a tunnel insulating layer 115, a channel layer 117, and a core insulating layer 119 that extend in a vertical direction.

The core insulating layer 119 may extend in the vertical direction from a center region of the channel structure CH and may be formed of an insulating layer, such as an oxide layer. A dopant may be injected into a partial region of the core insulating layer 119, and the partial region in which the dopant is injected may have a dielectric constant that is lower than that of another region. For example, a dopant is injected into a region of the core insulating layer 119 extending in the vertical direction that is adjacent to the gate electrode GA used as the drain select line DSL, and a dopant is not injected into a region of the core insulating layer 119 extending in the vertical direction that is adjacent to the gate electrode GA used as the word line WLn. That is, the dopant is injected into the core insulating layer 119 that is adjacent to the drain select transistor, and thus the dielectric constant of the core insulating layer 119 that is adjacent to the drain select transistor is lower than that of the core insulating layer 119 that is adjacent to the memory cells.

The dopant that is injected into the core insulating layer 119 may be carbon (C) or fluorine (F), or both carbon and fluorine.

The channel layer 117 may be used as a channel region of the cell string. The channel layer 117 may include a semiconductor layer. As an embodiment, the channel layer 117 may include silicon.

The tunnel insulating layer 115 may surround a sidewall of the channel layer 117. The tunnel insulating layer 115 may be formed of a silicon oxide layer that is capable of charge tunneling.

The charge storage layer 113 may surround a sidewall of the tunnel insulating layer 115. The charge storage layer 113 may be formed of a material layer that is capable of storing data that is changed by using Fowler Nord-Heim tunneling. As an embodiment, the charge storage layer 113 may be formed of a charge trap nitride layer.

The blocking insulating layer 111 may surround a sidewall of the charge storage layer 113. The blocking insulating layer 111 may include an oxide layer that is capable of blocking a charge.

As described above, in an embodiment of the present disclosure, the core insulating layer 119 may be formed so that the dielectric constant of the core insulating layer 119 that is adjacent to the drain select transistor is lower than that of the core insulating layer 119 that is adjacent to the memory cell by injecting the dopant into the partial region of the core insulating layer 119. Accordingly, a body effect of the drain select transistor decreases, a threshold voltage increases, and a leakage current decreases. In addition, a gate induced drain leakage (GIDL) current may be more easily generated according to a voltage difference between a source and a body of the drain select transistor during the erase operation.

Figure 5B:
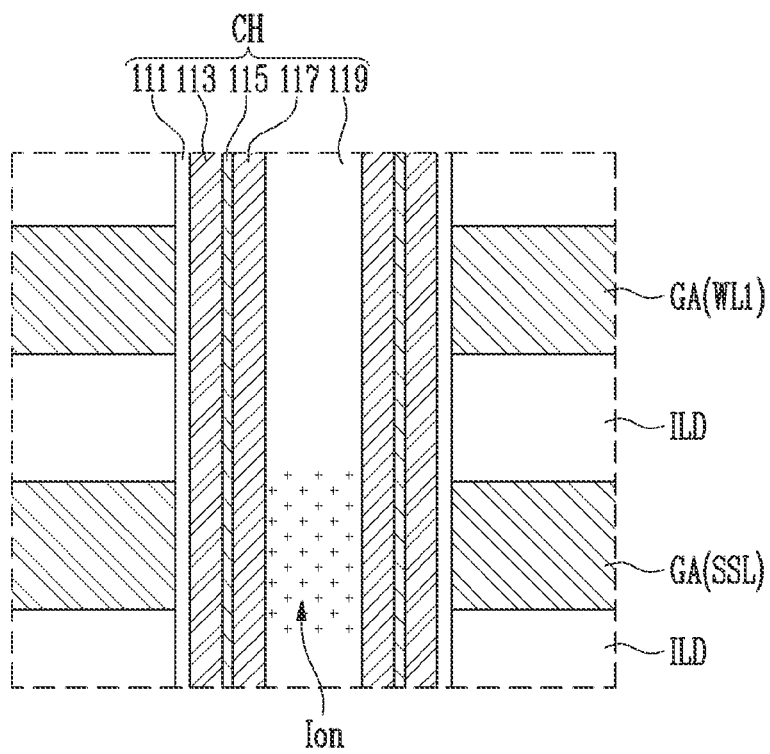
FIG. 5B is an enlarged view of a region S of FIG. 4.

FIG. 5B is an enlarged view of a region S of FIG. 4.

Referring to FIG. 5B, a dopant may be injected into a partial region of the core insulating layer 119, and the partial region in which the dopant is injected may have a dielectric constant that is lower than that of another region. For example, a dopant is injected into a region of the core insulating layer 119 extending in the vertical direction that is adjacent to the gate electrode GA used as the source select line SSL, and a dopant is not injected into a region of the core insulating layer 119 extending in the vertical direction that is adjacent to the gate electrode GA used as the word line WL1. That is, the dopant is injected into the core insulating layer 119 that is adjacent to the source select transistor, and thus the dielectric constant of the core insulating layer 119 that is adjacent to the source select transistor is lower than that of the core insulating layer 119 that is adjacent to the memory cells.

The dopant that is injected into the core insulating layer 119 may be carbon (C) or fluorine (F), or both carbon and fluorine.

As described above, in an embodiment of the present disclosure, the core insulating layer 119 is formed so that the dielectric constant of the core insulating layer 119 that is adjacent to the source select transistor is lower than that of the core insulating layer 119 that is adjacent to the memory cell by injecting the dopant into the partial region of the core insulating layer 119. Accordingly, a body effect of the source select transistor decreases, a threshold voltage increases, and a leakage current decreases. In addition, a gate induced drain leakage (GIDL) current may be more easily generated according to a voltage difference between a source and a body of the source select transistor during the erase operation.

According to the above-described FIGS. 4, 5A and 5B, in an embodiment of the present disclosure, the core insulating layer is formed so that the dielectric constant of the core insulating layer that is adjacent to the drain select transistor or the core insulating layer that is adjacent to the source select transistor is lower than that of the core insulating layer that is adjacent to the memory cell. Accordingly, a leakage current characteristic of the drain select transistor or the source select transistor, and the generation of the GIDL current during the erase operation may be increased.

FIGS. 6A to 6E are cross-sectional views illustrating a method of manufacturing a memory cell array according to an embodiment of the present disclosure.

Figure 6A:
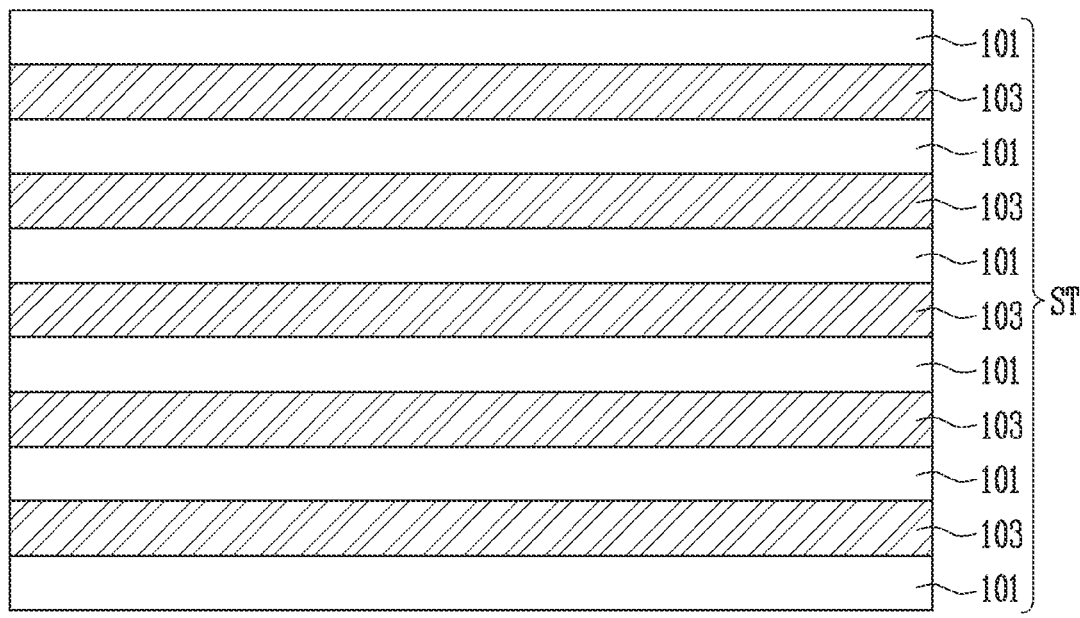
FIGS. 6A to 6E are cross-sectional views illustrating a method of manufacturing a memory cell array according to an embodiment of the present disclosure.

Referring to FIG. 6A, a stack ST in which interlayer insulating layers 101 and sacrificial layers 103 may be alternately stacked may be formed. The stack ST may be formed on a substrate (not shown) with the peripheral circuit.

The sacrificial layers 103 may be formed of a material that is different from that of the interlayer insulating layers 101. For example, the interlayer insulating layers 101 may be formed of an oxide, such as a silicon oxide layer. The sacrificial layers 103 may be formed of a material with an etch rate that is different from that of the interlayer insulating layers 101. For example, the sacrificial layers 103 may be formed of nitride, such as a silicon nitride layer.

Figure 6B:
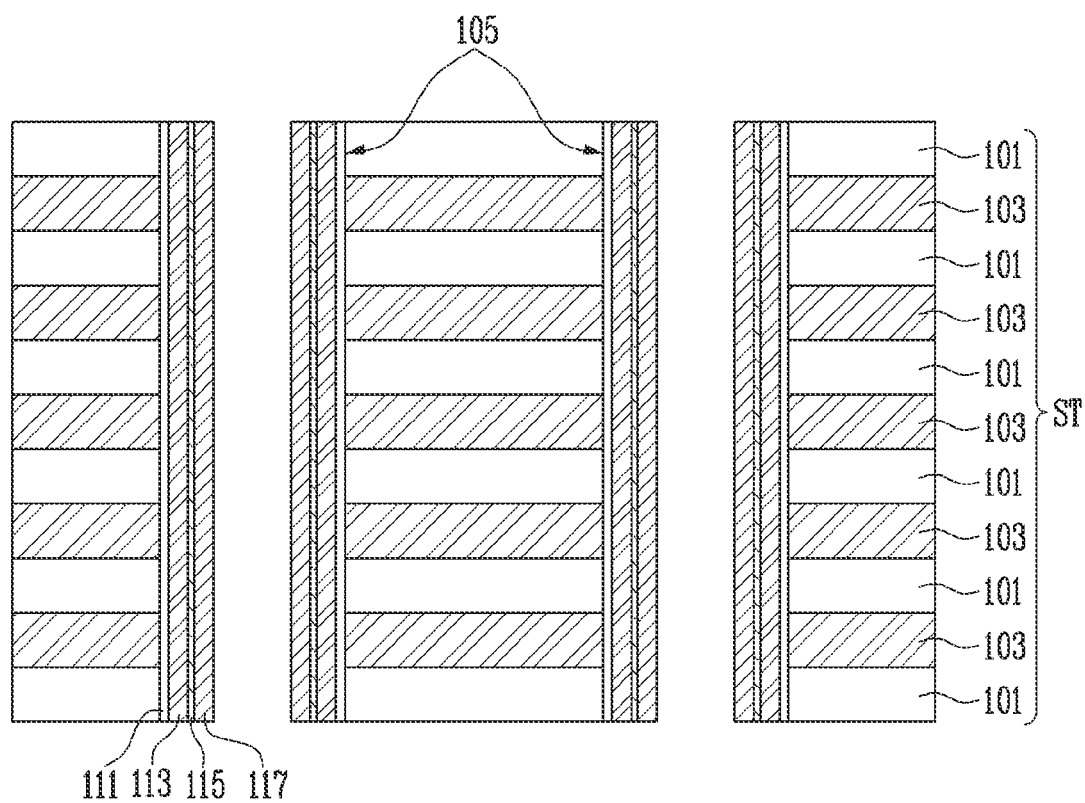

Referring to FIG. 6B, holes 105 that pass through the stack ST are formed. Thereafter, the blocking insulating layer 111, the charge storage layer 113, the tunnel insulating layer 115, and the channel layer 117 may be sequentially formed on a sidewall of the holes 105.

The blocking insulating layer 111 may include an oxide layer that is capable of blocking a charge. As an embodiment, the blocking insulating layer 111 may be formed of $Al_2O_3$.

The charge storage layer 113 may be formed of a charge trap layer, a material layer with a conductive nanodot, or a phase change material layer. For example, the charge storage layer 113 may store data that is changed by using Fowler-Nordheim tunneling. To this end, the charge storage layer 113 may be formed of a silicon nitride layer that is capable of trapping a charge.

The tunnel insulating layer 115 may be formed of a silicon oxide layer that is capable of charge tunneling.

The channel layer 117 may include a semiconductor layer. As an embodiment, the channel layer 117 may include silicon.

Figure 6C:
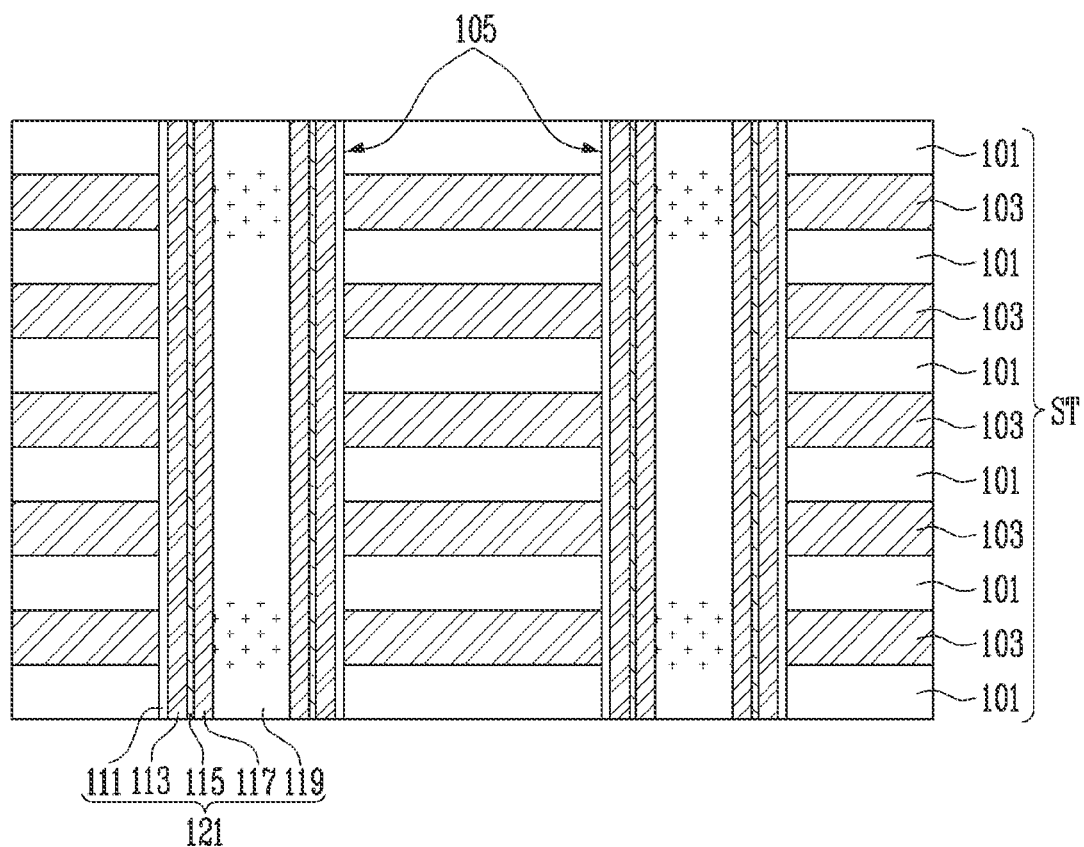

Referring to FIG. 6C, a channel structure 121 may be formed by filling a central region of the holes 105 with the core insulating layer 119.

In the process of forming the core insulating layer 119, an impurity injection process may be performed to form an impurity injection region in the partial region of the core insulating layer 119. In an embodiment, the impurity injection region may be a region of the core insulating layer 119 that is adjacent to a region in which the drain select transistor is to be formed or a region that is adjacent to a region in which the source select transistor is to be formed.

In an embodiment, after forming the core insulating layer 119 from a lower surface of the holes 105 to a height at which the source select transistor is formed, the impurity may be injected into the core insulating layer 119 of the region that is adjacent to the region where the source select transistor is to be formed by performing the impurity injection process. Thereafter, after forming the core insulating layer 119 at a center region of the holes 105 to a height at which the drain select transistor is formed, the impurity may be injected into the core insulating layer 119 of the region that is adjacent to the region in which the drain select transistor is to be formed by performing the impurity injection process.

In another embodiment, after filling the center region of the holes 105 with the core insulating layer 119 from the lower surface to an opening, the impurity is injected into the region that is adjacent to the region in which the source select transistor is to be formed and the region that is adjacent to the region in which the drain select transistor is to be formed by performing the impurity injection process. At this time, the impurity may be injected into the region that is adjacent to the region in which the source select transistor is to be formed and the region that is adjacent to the region in which the drain select transistor is to be formed by adjusting an injection depth during the impurity injection process.

The impurity that is used during the impurity injection process may be carbon or fluorine, or both carbon and fluorine.

The dielectric constant of the region of the core insulating layer 119 into which the impurity is injected may be lower than that of another region of the core insulating layer 119 due to the impurity.

Figure 6D:
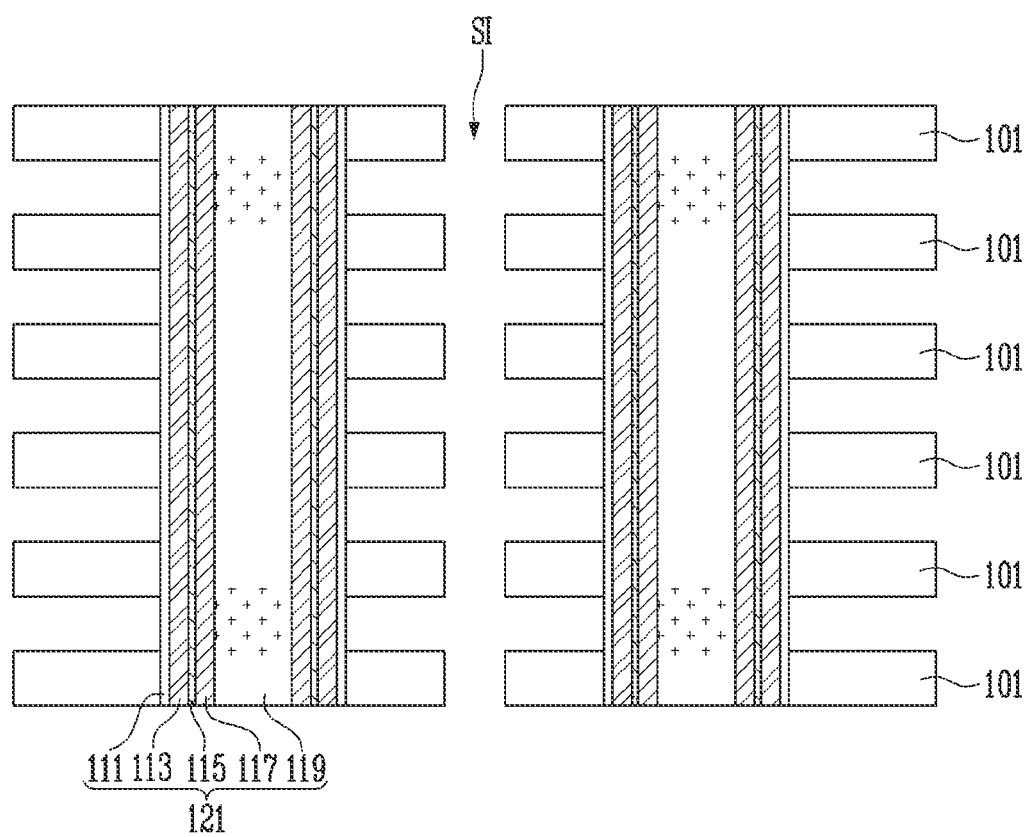

Referring to FIG. 6D, the slit SI that passes through the stack ST may be formed. A sidewall of the sacrificial layers 103, shown in FIG. 6C, may be exposed by the slit SI. Thereafter, the sacrificial layers 103, shown in FIG. 6C, may be removed through the slit SI. Accordingly, openings that expose a side portion of the blocking insulating layer 111 may be formed. The openings may be defined between the interlayer insulating layers 101.

Figure 6E:
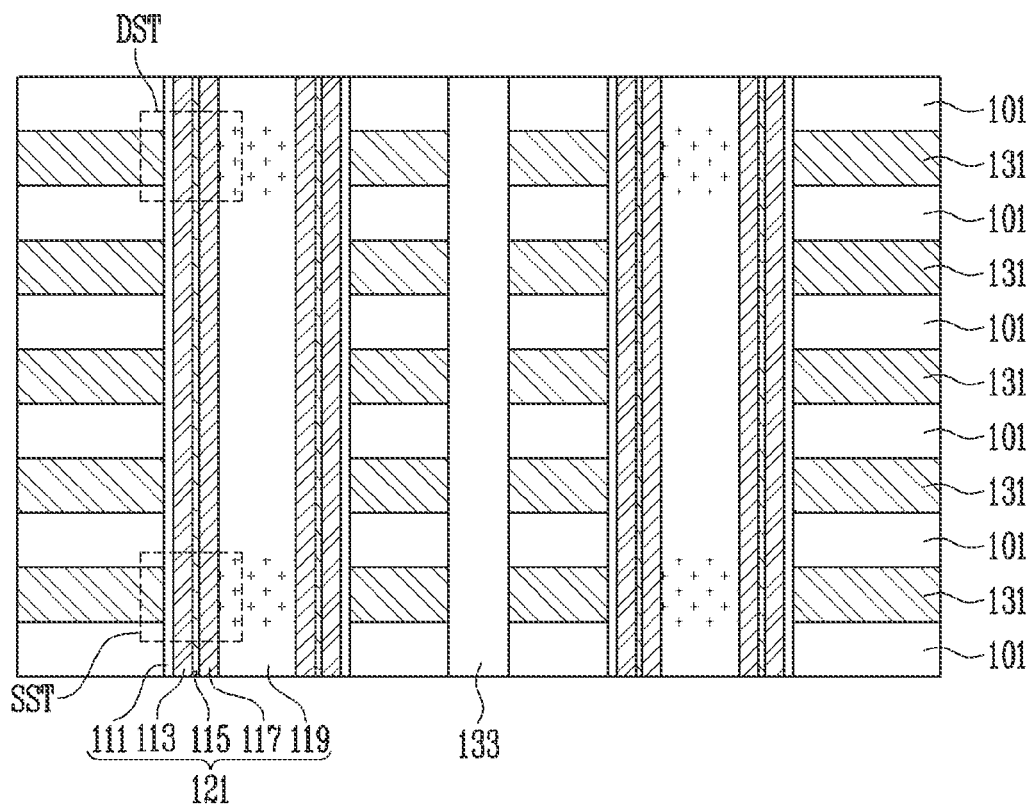

Referring to FIG. 6E, gate electrodes 131 may be filled in a space in which the sacrificial layers are removed, that is, the openings. For example, after depositing a conductive material to fill the openings, the conductive material that is inside the slit may be removed so that the conductive material is separated into the gate electrodes 131 by the slit. Thereafter, the slit may be filled with an insulating material to form the vertical structure 133.

Accordingly, the core insulating layer 119 may be formed by injecting the impurity into the core insulating layer 119 that is adjacent to the drain select transistor DST or the core insulating layer 119 that is adjacent to the source select transistor SST. Accordingly, the core insulating layer 119 that is adjacent to the drain select transistor DST or the core insulating layer 119 that is adjacent to the source select transistor SST may have a dielectric constant that is relatively lower than that of the core insulating layer 119 that is adjacent to the memory cells.

In an embodiment of the present disclosure, the core insulating layer 119 may be formed so that the dielectric constant of the partial region is lower than that of another region by injecting the dopant only in the partial region. However, the entire region of the core insulating layer 119 may be formed with a low dielectric constant by injecting the dopant into the entire region of the core insulating layer 119.

Figure 7:
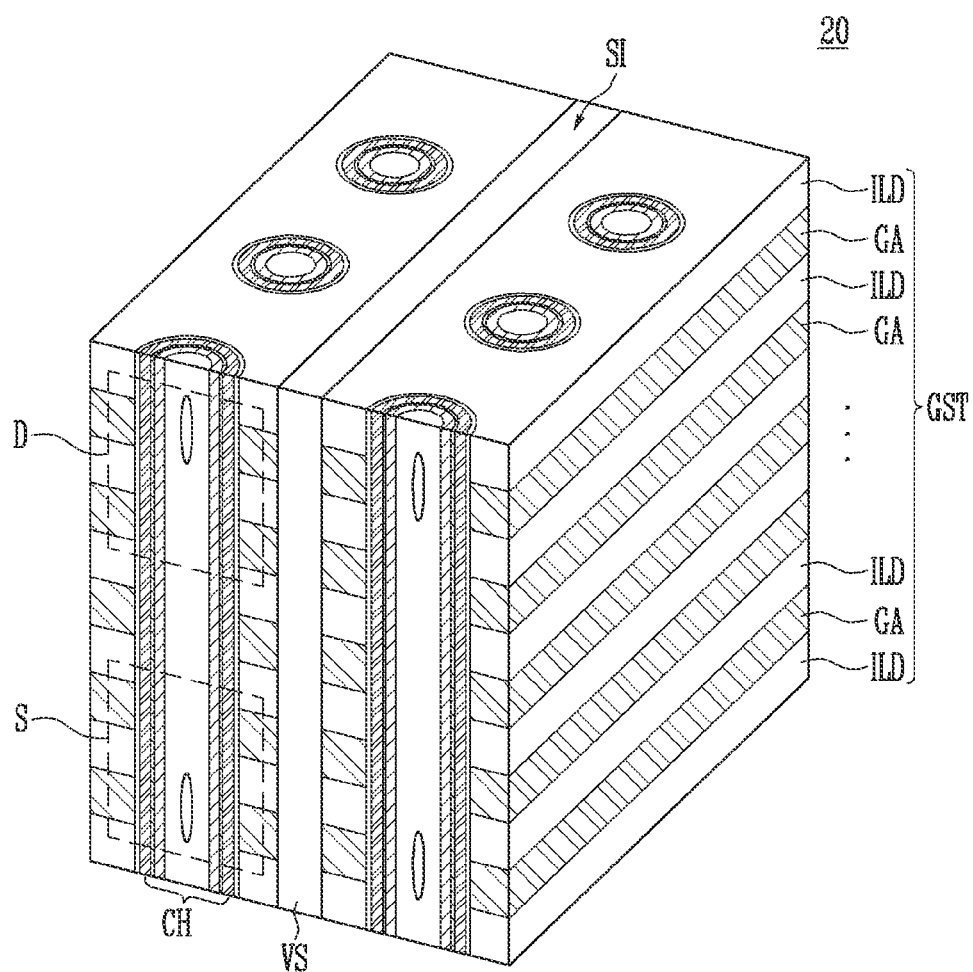
FIG. 7 is a perspective view illustrating a portion of a memory cell array of a semiconductor memory device according to another embodiment of the present disclosure.

FIG. 7 is a perspective view illustrating a portion of a memory cell array of a semiconductor memory device according to another embodiment of the present disclosure.

Referring to FIG. 7, the memory cell array 20 may include gate stacks GST that are separated from each other by a slit SI and channel structures CH that pass through each of the gate stacks GST.

The slit SI may be filled with a vertical structure VS. As an embodiment, the vertical structure VS may include an insulating material.

Each of the gate stacks GST may include interlayer insulating layers ILD and gate electrodes GA that are alternately stacked in one direction. Hereinafter, a direction in which the interlayer insulating layers ILD and the gate electrodes GA are alternately stacked is referred to as a stack direction.

At least one gate electrode that is disposed at a lowermost layer of the gate electrodes GA may be used as the source select line, and at least one gate electrode that is disposed at an uppermost layer may be used as the drain select line.

The gate electrodes GA may include at least one of a doped semiconductor, a metal, a metal silicide, or a metal nitride layer. The gate electrodes GA may be used as a gate electrode of a memory cell or a gate electrode of a select transistor.

The channel structure CH may extend in the stack direction and may be surrounded by the gate electrodes GA.

The channel structure CH, according to an embodiment of the present disclosure, may be formed so that a dielectric constant of a core insulating layer that is adjacent to the drain select transistor or the source select transistor is lower than that of the core insulating layer that is adjacent to the memory cells. For example, a gap may be formed in the core insulating layer that is adjacent to the drain select transistor or the source select transistor.

In an embodiment of the present disclosure, as shown in FIG. 3A described above, an embodiment in which one or more gate stacks that are disposed at a lowermost portion of the gate stacks GST is used as the source select line and one or more gate stacks that are disposed at an uppermost portion is used as the drain select line is described as an example. However, the present disclosure is not limited thereto, and as shown in FIG. 3B described above, one or more gate stacks that are disposed at the lowermost portion may be used as the drain select line and one or more gate stacks that are disposed at the uppermost portion of the gate stacks GST may be used as the source select line.

Figure 8A:
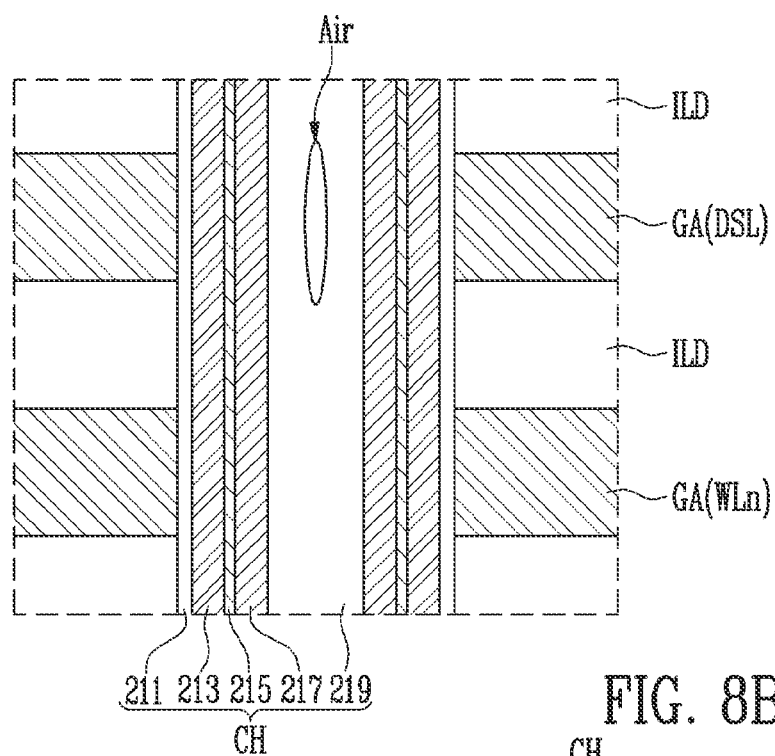
FIG. 8A is an enlarged view of a region D of FIG. 7.

FIG. 8A is an enlarged view of a region D of FIG. 7.

Referring to 8A, the channel structure CH may include a blocking insulating layer 211, a charge storage layer 213, a tunnel insulating layer 215, a channel layer 217, and a core insulating layer 219 extending in a vertical direction.

The core insulating layer 219 may extend in the vertical direction from a center region of the channel structure CH, and may be formed of an insulating layer, such as an oxide layer. A gap Air may be formed in a partial region of the core insulating layer 219, and the partial region in which the gap Air is formed may have a dielectric constant that is lower than that of another region. For example, the gap Air may be formed in a region of the core insulating layer 219 that extends in the vertical direction that is adjacent to the gate electrode GA used as the drain select line DSL, and the gap Air is not formed in a region of the core insulating layer 219 extending in the vertical direction that is adjacent to the gate electrode GA used as the word line WLn. That is, the gap Air may be formed in the core insulating layer 219 that is adjacent to the drain select transistor, and thus, the dielectric constant of the core insulating layer 219 that is adjacent to the drain select transistor may be lower than that of the core insulating layer 219 that is adjacent to the memory cells.

The channel layer 217 may be used as a channel region of the cell string. The channel layer 217 may include a semiconductor layer. As an embodiment, the channel layer 217 may include silicon.

The tunnel insulating layer 215 may surround a sidewall of the channel layer 217. The tunnel insulating layer 215 may be formed of a silicon oxide layer that is capable of charge tunneling.

The charge storage layer 213 may surround a sidewall of the tunnel insulating layer 215. The charge storage layer 213 may be formed of a material layer that is capable of storing data that is changed by using Fowler Nord-Heim tunneling. As an embodiment, the charge storage layer 213 may be formed of a charge trap nitride layer.

The blocking insulating layer 211 may surround a sidewall of the charge storage layer 213. The blocking insulating layer 211 may include an oxide layer that is capable of blocking a charge.

As described above, in an embodiment of the present disclosure, the core insulating layer 219 may be formed so that the dielectric constant of the core insulating layer 219 that is adjacent to the drain select transistor is lower than that of the core insulating layer 219 that is adjacent to the memory cell by forming the gap Air in the partial region of the core insulating layer 219. Accordingly, a body effect of the drain select transistor decreases, a threshold voltage increases, and a leakage current decreases. In addition, a gate induced drain leakage (GIDL) current may be more easily generated according to a voltage difference between a source and a body of the drain select transistor during the erase operation.

Figure 8B:
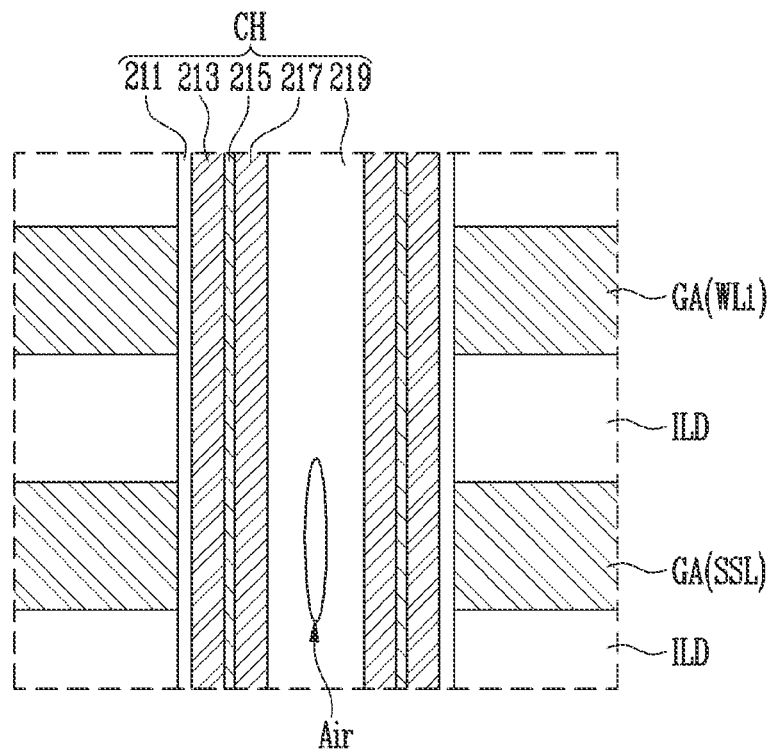
FIG. 8B is an enlarged view of a region S of FIG. 7.

FIG. 8B is an enlarged view of a region S of FIG. 7.

Referring to FIG. 8B, a gap Air may be formed in a partial region of the core insulating layer 219, and the partial region in which the gap Air is formed may have a dielectric constant that is lower than that of another region. For example, the gap Air may be formed in a region of the core insulating layer 219 that extends in the vertical direction, adjacent to the gate electrode GA, used as the source select line SSL, and the gap Air might not be formed in a region of the core insulating layer 219 extending in the vertical direction that is adjacent to the gate electrode GA used as the word line WL1. That is, the gap Air may be formed in the core insulating layer 219 that is adjacent to the source select transistor, and thus, the dielectric constant of the core insulating layer 219 that is adjacent to the source select transistor is lower than that of the core insulating layer 219 that is adjacent to the memory cells.

As described above, in an embodiment of the present disclosure, the core insulating layer 219 may be formed so that the dielectric constant of the core insulating layer 219 that is adjacent to the source select transistor is lower than that of the core insulating layer 219 that is adjacent to the memory cell by forming the gap Air in the partial region of the core insulating layer 219. Accordingly, a body effect of the source select transistor decreases, a threshold voltage increases, and a leakage current decreases. In addition, a gate induced drain leakage (GIDL) current may be more easily generated according to a voltage difference between a source and a body of the source select transistor during the erase operation.

According to the above-described FIGS. 7, 8A and 8B, in an embodiment of the present disclosure, the core insulating layer may be formed so that the dielectric constant of the core insulating layer that is adjacent to the drain select transistor or the core insulating layer that is adjacent to the source select transistor is lower than that of the core insulating layer that is adjacent to the memory cell. Accordingly, a leakage current characteristic of the drain select transistor or the source select transistor, and generation of the GIDL current during the erase operation may be increased.

FIGS. 9A to 9E are cross-sectional views illustrating a method of manufacturing a memory cell array according to another embodiment of the present disclosure.

Figure 9A:
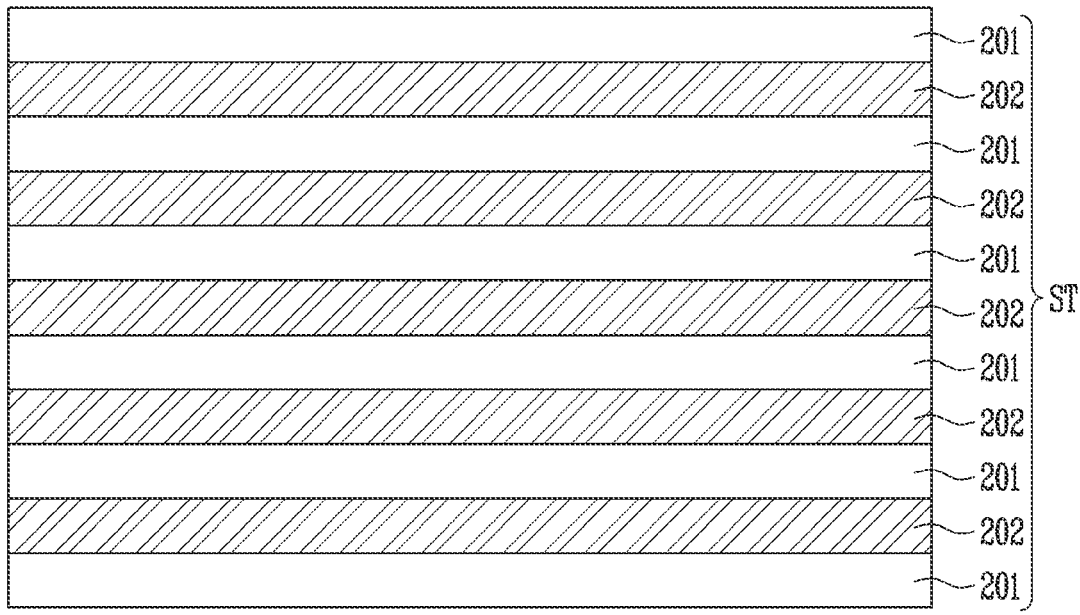
FIGS. 9A to 9E are cross-sectional views illustrating a method of manufacturing a memory cell array according to another embodiment of the present disclosure.

Referring to FIG. 9A, a stack ST in which interlayer insulating layers 201 and sacrificial layers 203 are alternately stacked may be formed. The stack ST may be formed on a substrate (not shown) with the peripheral circuit.

The sacrificial layers 203 may be formed of a material that is different from that of the interlayer insulating layers 201. For example, the interlayer insulating layers 201 may be formed of an oxide, such as a silicon oxide layer. The sacrificial layers 203 may be formed of a material with an etch rate that is different from that of the interlayer insulating layers 201. For example, the sacrificial layers 203 may be formed of nitride, such as a silicon nitride layer.

Figure 9B:
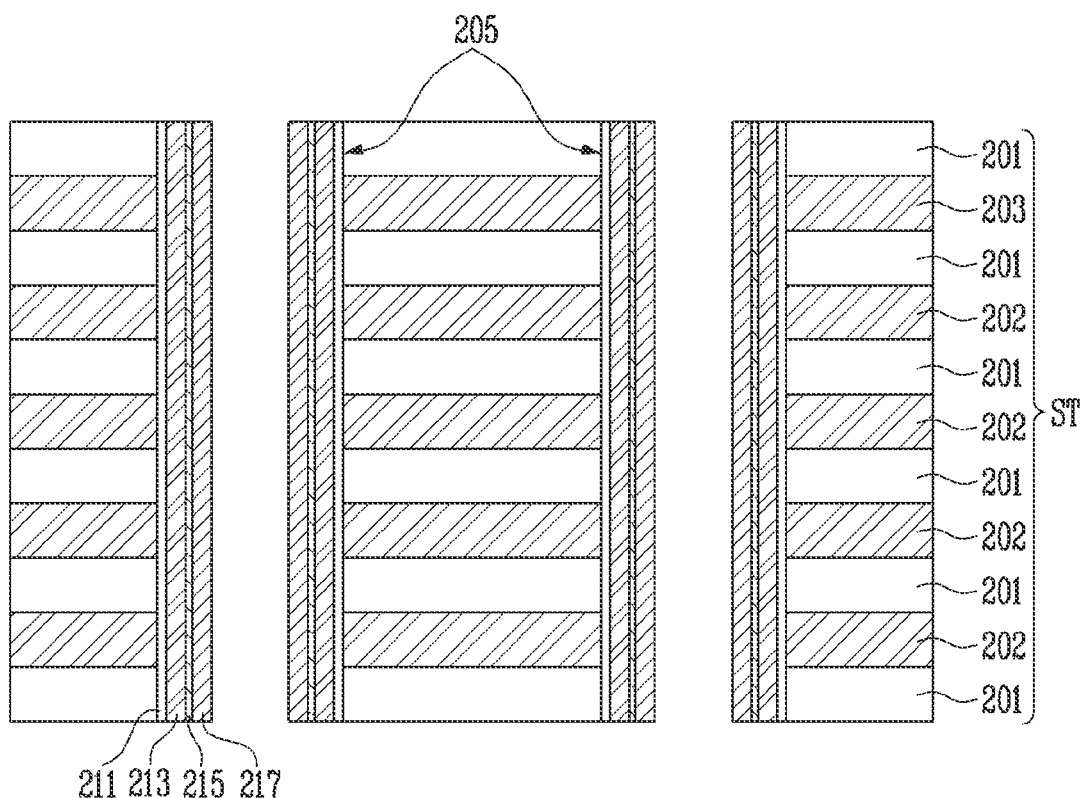

Referring to FIG. 9B, holes 205 that pass through the stack ST are formed. Thereafter, the blocking insulating layer 211, the charge storage layer 213, the tunnel insulating layer 215, and the channel layer 217 may be sequentially formed on a sidewall of the holes 205.

The blocking insulating layer 211 may include an oxide layer that is capable of blocking a charge. As an embodiment, the blocking insulating layer 211 may be formed of $Al_2O_3$.

The charge storage layer 213 may be formed of a charge trap layer, a material layer with a conductive nanodot, or a phase change material layer. For example, the charge storage layer 213 may store data that is changed by using Fowler-Nordheim tunneling. To this end, the charge storage layer 213 may be formed of a silicon nitride layer that is capable of trapping a charge.

The tunnel insulating layer 215 may be formed of a silicon oxide layer that is capable of charge tunneling.

The channel layer 217 may include a semiconductor layer. As an embodiment, the channel layer 217 may include silicon.

Figure 9C:
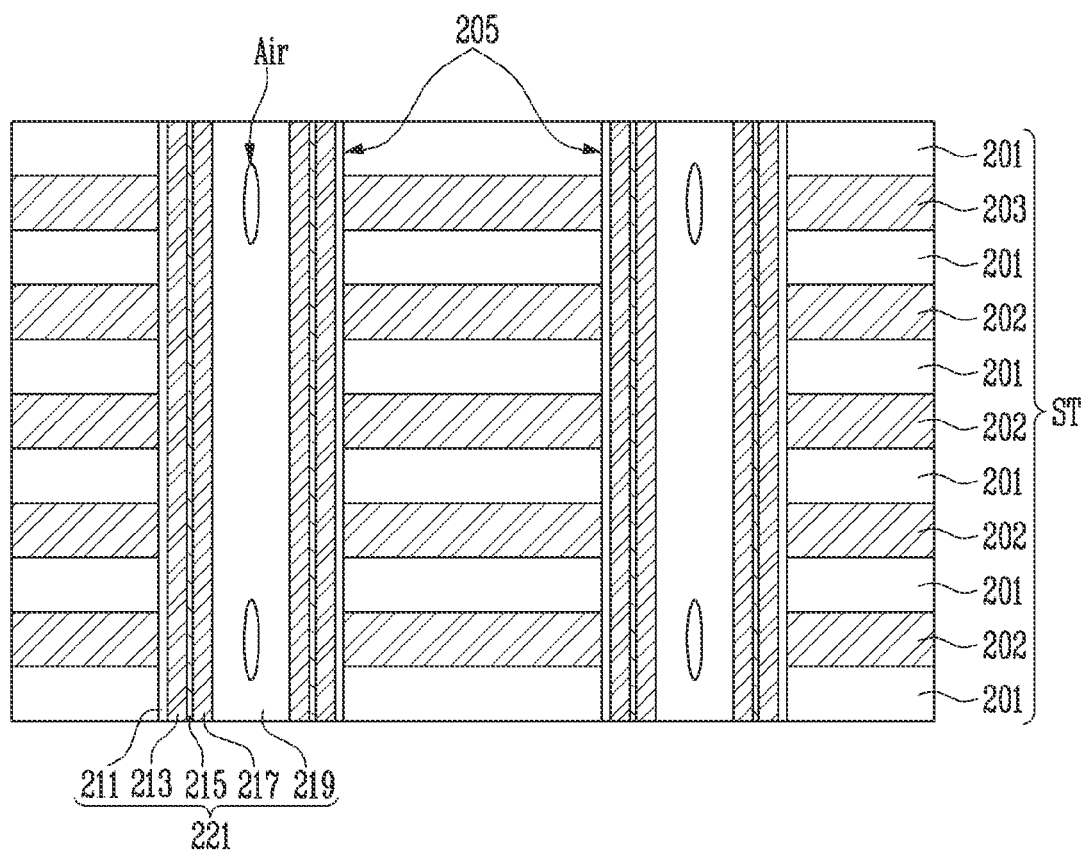

Referring to FIG. 9C, a channel structure 221 may be formed by filling a central region of the holes 205 with the core insulating layer 219.

In a process of forming the core insulating layer 219, the gap Air may be formed in the partial region of the core insulating layer 219 by adjusting a deposition rate and a step coverage. In an embodiment, the gap Air may be formed in a region of the core insulating layer 219 that is adjacent to a region in which the drain select transistor is to be formed or a region that is adjacent to a region in which the source select transistor is to be formed.

The dielectric constant of the region of the core insulating layer 219 in which the gap Air is formed may be lower than that of another region of the core insulating layer 219 due to the gap Air.

Figure 9D:
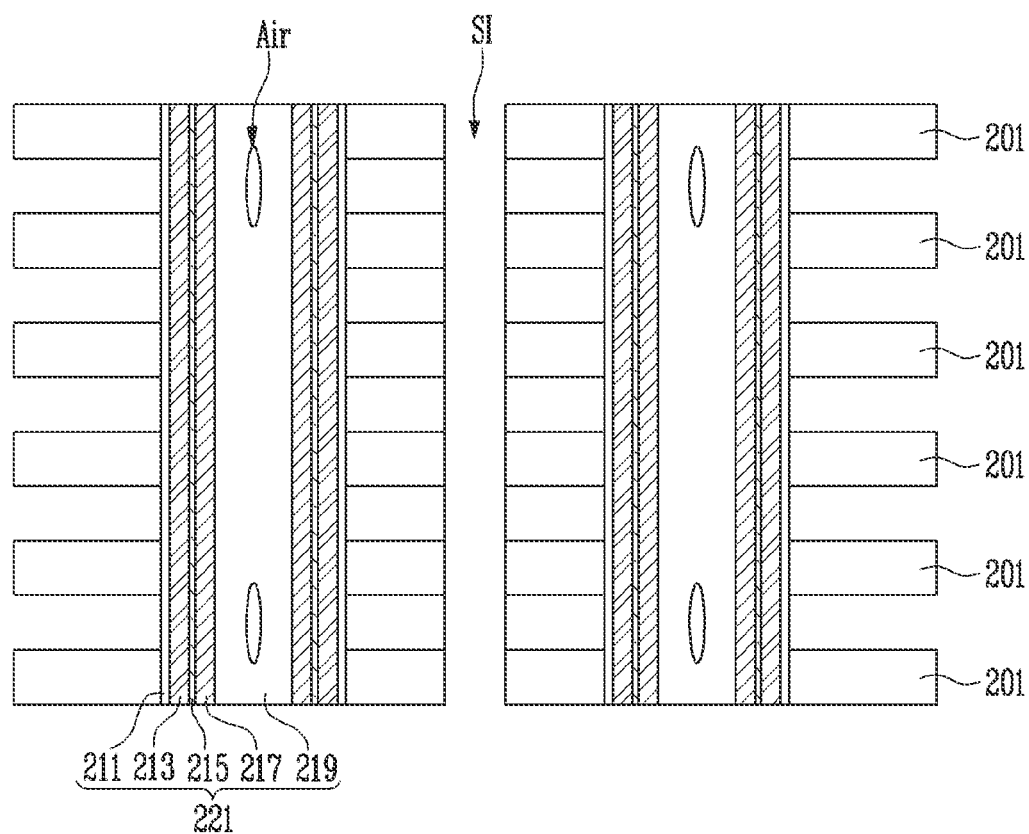

Referring to FIG. 9D, the slit SI that passes through the stack ST may be formed. A sidewall of the sacrificial layers 203, shown in FIG. 9C, may be exposed by the slit SI. Thereafter, the sacrificial layers 203, shown in FIG. 9C, may be removed through the slit SI. Accordingly, openings that expose a side portion of the blocking insulating layer 211 may be formed. The openings may be defined between the interlayer insulating layers 201.

Figure 9E:
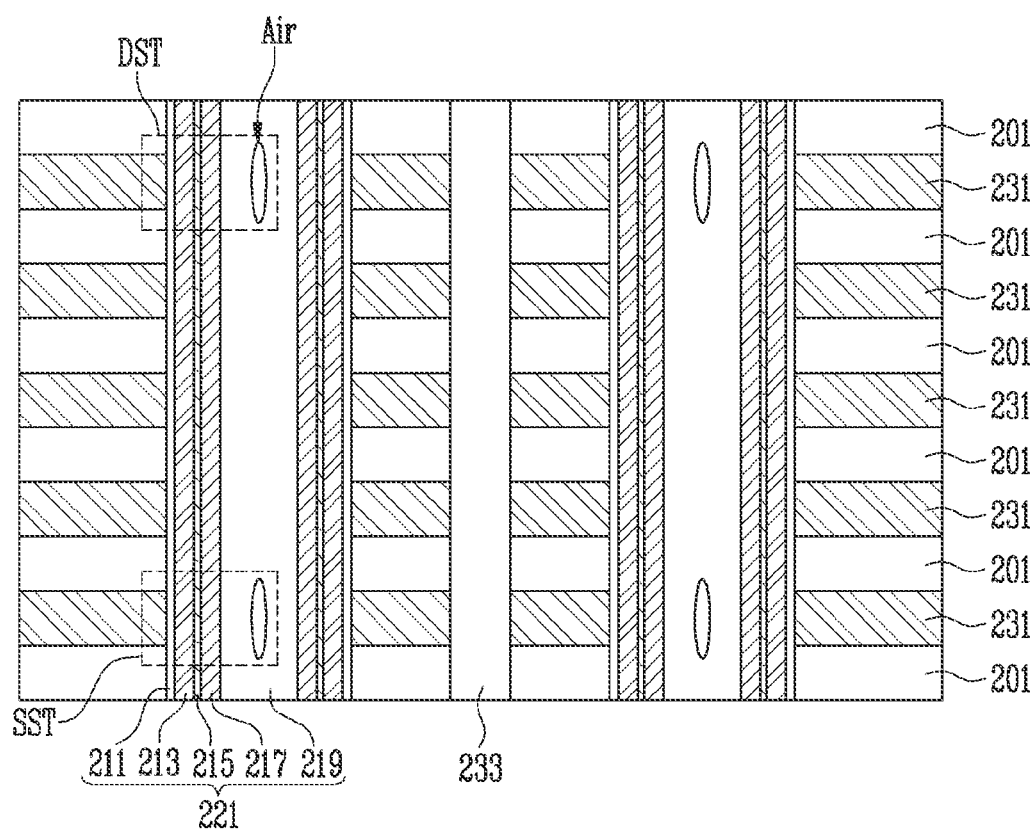

Referring to FIG. 9E, gate electrodes 231 may be filled in a space in which the sacrificial layers are removed, that is, the openings. For example, after depositing a conductive material to fill the openings, the conductive material that is inside the slit may be removed so that the conductive material is separated into the gate electrodes 231 by the slit. Thereafter, the slit may be filled with an insulating material to form the vertical structure 233.

Accordingly, the gap Air may be formed inside the core insulating layer 219 that is adjacent to the drain select transistor DST or the core insulating layer 219 that is adjacent to the source select transistor SST. Accordingly, the core insulating layer 219 that is adjacent to the drain select transistor DST or the core insulating layer 219 that is adjacent to the source select transistor SST may have a dielectric constant that is relatively lower than that of the core insulating layer 219 that is adjacent to the memory cells.

In an embodiment of the present disclosure, the core insulating layer 219 may be formed so that the dielectric constant of the partial region is lower than that of another region by forming the gap Air in only the partial region. However, the entire region of the core insulating layer 219 may be formed with a low dielectric constant by forming the gap Air in the entire region of the core insulating layer 219.

Figure 10:
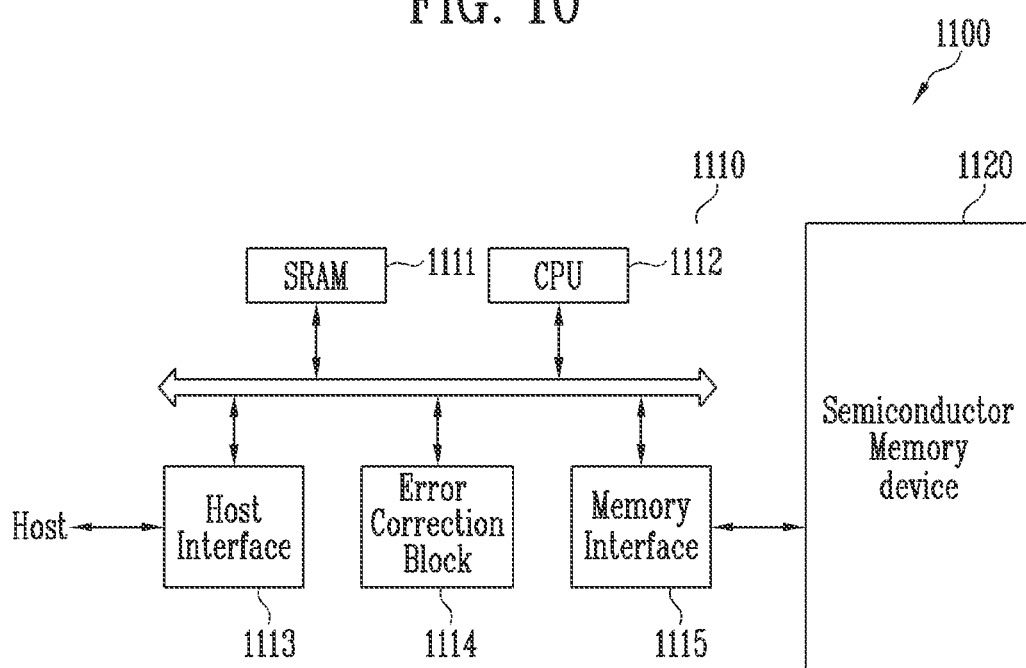
FIG. 10 is a block diagram illustrating a configuration of a memory system according to an embodiment of the present disclosure.

FIG. 10 is a block diagram illustrating a configuration of a memory system 1100 according to an embodiment of the present disclosure.

Referring to FIG. 10, the memory system 1100 includes a semiconductor memory device 1120 and a memory controller 1110.

The semiconductor memory device 1120 includes a plurality of channel structures that pass through a stack structure in which a plurality of interlayer insulating layers and a plurality of gate electrodes are alternately stacked. The plurality of channel structures may include a blocking insulating layer, a charge storage layer, a tunnel insulating layer, a channel layer, and a core insulating layer. In an embodiment, in the core insulating layer, the dielectric constant of the core insulating layer that is adjacent to the drain select transistor may be lower than that of the core insulating layer that is adjacent to the memory cells and the core insulating layer that is adjacent to the source select transistor. In another embodiment, the dielectric constant of the core insulating layer that is adjacent to the drain select transistor and the core insulating layer that is adjacent to the source select transistor may be lower than that of the core insulating layer that is adjacent to the memory cells.

The semiconductor memory device 1120 may be configured like the semiconductor memory device shown in FIG. 4 or 7.

The semiconductor memory device 1120 may be a multi-chip package configured of a plurality of flash memory chips.

The memory controller 1110 may be configured to control the semiconductor memory device 1120, and may include a static random access memory (SRAM) 1111, a central processing unit (CPU) 1112, a host interface 1113, and an error correction block 1114, and a memory interface 1115. The SRAM 1111 is used as an operation memory of the CPU 1112, the CPU 1112 performs an overall control operation for data exchange of the memory controller 1110, and the host interface 1113 includes a data exchange protocol of a host that is connected to the memory system 1100. In addition, the error correction block 1114 detects and corrects an error included in data read from the memory device 1120, and the memory interface 1115 performs interfacing with the memory device 1120. In addition, the memory controller 1110 may further include a read only memory (ROM) that stores code data for interfacing with the host.

Figure 11:
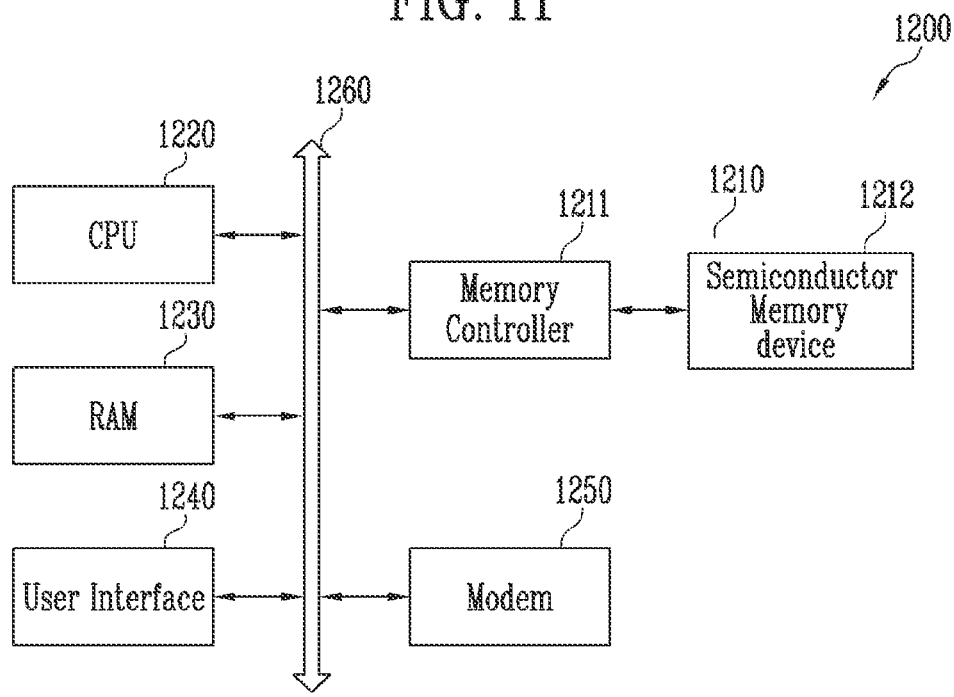
FIG. 11 is a block diagram illustrating a configuration of a computing system according to an embodiment of the present disclosure.

FIG. 11 is a block diagram illustrating a configuration of a computing system according to an embodiment of the present disclosure.

Referring to FIG. 11, the computing system 1200 may include a CPU 1220, a random access memory (RAM) 1230, a user interface 1240, a modem 1250, and a memory system 1210 that are electrically connected to a system bus 1260. The computing system 1200 may be a mobile device.

The memory system 1210 may include a semiconductor memory device 1212 and a memory controller 1211. The semiconductor memory device 1212 includes a plurality of channel structures that pass through a stack structure in which a plurality of interlayer insulating layers and a plurality of gate electrodes are alternately stacked. The plurality of channel structures may include a blocking insulating layer, a charge storage layer, a de-trap prevention layer, a tunnel insulating layer, a channel layer, and a core insulating layer. In an embodiment, in the core insulating layer, the dielectric constant of the core insulating layer that is adjacent to the drain select transistor may be lower than that of the core insulating layer that is adjacent to the memory cells and the core insulating layer that is adjacent to the source select transistor. In another embodiment, the dielectric constant of the core insulating layer that is adjacent to the drain select transistor and the core insulating layer that is adjacent to the source select transistor may be lower than that of the core insulating layer that is adjacent to the memory cells.

The semiconductor memory device 1212 may be configured like the semiconductor memory device shown in FIG. 4 or 7.

Although the detailed description of the present disclosure describes specific embodiments, various changes and modifications may be made without departing from the scope and technical spirit of the present disclosure. Therefore, the scope of the present disclosure should not be limited to the above-described embodiments, and should be determined by the equivalents of the claims of the present disclosure as well as the following claims.

What is claimed is:

1. A semiconductor memory device comprising:
   a stack with a plurality of interlayer insulating layers and a plurality of gate electrodes that are alternately stacked on a substrate; and
   a plurality of channel structures passing through the stack in a vertical direction, wherein each of the plurality of channel structures includes a core insulating layer, a channel layer, a tunnel insulating layer, and a charge storage layer that vertically extend in the same direction as the plurality of channel structures, and wherein a dielectric constant of a first region of the core insulating layer, which corresponds to a source select transistor or a drain select transistor, is lower than a dielectric constant of a second region of the core insulating layer which corresponds to memory cells.

2. The semiconductor memory device of claim 1, wherein the first region of the core insulating layer is adjacent to a first gate electrode of the source select transistor or a second gate electrode of the drain select transistor.

3. The semiconductor memory device of claim 1, wherein a dopant is injected into the first region of the core insulating layer.

4. The semiconductor memory device of claim 3, wherein the dopant is carbon, fluorine, or both carbon and fluorine.

5. The semiconductor memory device of claim 1, wherein the first region of the core insulating layer includes a gap.

6. A semiconductor memory device comprising:

a stack with a plurality of interlayer insulating layers and gate electrodes alternately stacked on a substrate; and a plurality of channel structures passing through the stack in a vertical direction, wherein each of the plurality of channel structures includes a core insulating layer, a channel layer, a tunnel insulating layer, and a charge storage layer that vertically extend in the same direction as the plurality of channel structures, wherein at least one first gate electrode that is disposed at an uppermost portion of the gate electrodes corresponds to a drain select transistor, at least one second gate electrode that is disposed at a lowermost portion of the gate electrodes corresponds to a source select transistor, and remaining gate electrodes among the gate electrodes correspond to memory cells, and wherein a partial region of the core insulating layer that is adjacent to the first gate electrode or the second gate electrode has a dielectric constant that is lower than a dielectric constant of another region that is adjacent to the remaining gate electrodes.

7. The semiconductor memory device of claim 6, wherein a dopant is injected into the partial region of the core insulating layer.

8. The semiconductor memory device of claim 7, wherein the dopant is carbon, fluorine, or both carbon and fluorine.

9. The semiconductor memory device of claim 6, wherein a gap is formed in the partial region of the core insulating layer.

* * * * *